US006902832B2

(12) United States Patent
Uchida et al.

(10) Patent No.: US 6,902,832 B2
(45) Date of Patent: Jun. 7, 2005

(54) CHARGE-TRANSPORTING MATERIAL CONTAINING DIAZAPENTACENE DERIVATIVE, LUMINESCENT MATERIAL, AND ORGANIC ELECTROLUMINESCENT ELEMENT EMPLOYING THESE

(75) Inventors: Manabu Uchida, Yokohama (JP); Guofang Wang, Yokohama (JP); Takaharu Nakano, Yokohama (JP); Kenji Furukawa, Yokohama (JP); Keiji Okada, Yokohama (JP); Masatoshi Kozaki, Yokohama (JP)

(73) Assignee: Chisso Corporation, Osaka (JP)

( * ) Notice: Subject to any disclaimer, the term of this patent is extended or adjusted under 35 U.S.C. 154(b) by 0 days.

(21) Appl. No.: 10/332,044

(22) PCT Filed: Jun. 20, 2001

(86) PCT No.: PCT/JP01/05293

§ 371 (c)(1),
(2), (4) Date: Jan. 6, 2003

(87) PCT Pub. No.: WO02/05599

PCT Pub. Date: Jan. 17, 2002

(65) Prior Publication Data

US 2003/0099865 A1 May 29, 2003

(30) Foreign Application Priority Data

Jul. 7, 2000 (JP) ........................................ 2000-207242

(51) Int. Cl.[7] .............................................. H05B 33/12
(52) U.S. Cl. ..................... 428/690; 428/917; 313/504; 313/506; 257/40
(58) Field of Search .................. 428/690, 917; 313/504, 506; 257/40; 252/301.16; 544/14, 74, 75, 99

(56) References Cited

U.S. PATENT DOCUMENTS

| 4,047,948 A | 9/1977 | Horgan | |
|---|---|---|---|
| 4,536,457 A | 8/1985 | Tam | |
| 4,539,507 A | 9/1985 | VanSlyke et al. | 313/504 |
| 4,665,233 A | 5/1987 | Podder et al. | 564/406 |
| 4,769,292 A | 9/1988 | Tang et al. | 428/690 |
| 5,047,687 A | 9/1991 | VanSlyke | 313/503 |
| 5,061,569 A | 10/1991 | VanSlyke et al. | 428/457 |
| 5,256,945 A | 10/1993 | Imai et al. | 313/504 |
| 5,487,953 A | 1/1996 | Shirota et al. | 428/690 |
| 5,554,450 A | 9/1996 | Shi et al. | 428/690 |
| 5,840,217 A | 11/1998 | Lupo et al. | 252/583 |

FOREIGN PATENT DOCUMENTS

| DE | 25 34 713 | 2/1977 |
|---|---|---|
| JP | 57-144558 | 9/1982 |
| JP | 61-62038 | 3/1986 |
| JP | 61-112164 | 5/1986 |
| JP | 61-124949 | 6/1986 |
| JP | 61-134354 | 6/1986 |
| JP | 61-134355 | 6/1986 |
| JP | 63-264692 | 11/1988 |
| JP | 4-212286 | 8/1992 |
| JP | 4-308688 | 10/1992 |
| JP | 4-363891 | 12/1992 |
| JP | 5-234681 | 9/1993 |
| JP | 5-239455 | 9/1993 |
| JP | 6-1972 | 1/1994 |
| JP | 6-32307 | 4/1994 |
| JP | 6-267658 | 9/1994 |
| JP | 6-312979 | 11/1994 |
| JP | 7-90256 | 4/1995 |
| JP | 7-97355 | 4/1995 |
| JP | 7-126226 | 5/1995 |
| JP | 7-126615 | 5/1995 |
| JP | 7-138560 | 5/1995 |
| JP | 7-278637 | 10/1995 |
| JP | 7-331238 | 12/1995 |
| JP | 8-48656 | 2/1996 |
| JP | 8-87122 | 4/1996 |
| JP | 8-100172 | 4/1996 |
| JP | 8-259940 | 10/1996 |

OTHER PUBLICATIONS

T. Okamoto et al., "Synthesis and properties of benzooxazinophenooxazine and the related compounds", Synthetic Metals 120, pp. 933–934 (Mar. 15, 2001).*
C.W. Tang et al., "Electroluminescence of doped organic thin films", J. Appl. Phys., vol. 65, No. 9, pp. 3610–3616, May 1, 1989.

(Continued)

Primary Examiner—Marie Yamnitzky
(74) Attorney, Agent, or Firm—Wenderoth, Lind & Ponack, L.L.P.

(57) ABSTRACT

A charge transporting material, a light emitting material and an organic electroluminescent device having high efficiency using a specified diazapentacene derivative represented by the following general formula (1):

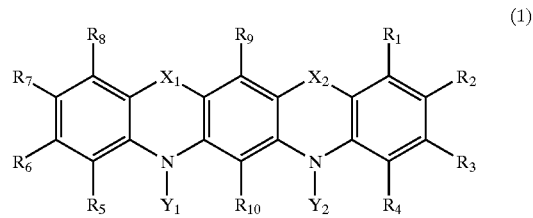

(1)

(in the general formula (1), $R_1$ to $R_{10}$ each represents independently a hydrogen atom, a halogen atom, an alkyl group of 1 to 6 carbon atoms, an alkoxy group, a substituted or not-substituted amino group, an aryl group or a heterocyclic group, in which the substituted or not-substituted aryl group or heterocyclic group, when they are adjacent with each other, may be of a structure condensed to each other, $X_1$ and $X_2$ each represents independently an oxygen atom or a sulfur atom, and $Y_1$ and $Y_2$ each represents independently a substituted or not-substituted alkyl group of 1 to 6 carbon atoms, an aryl group or a heterocyclic group).

5 Claims, No Drawings

OTHER PUBLICATIONS

Chihaya Adachi et al., "Electroluminescence in Organic Films with Three–Layer Structure", Japanese Journal of Applied Physics, vol. 27, No. 2, pp. L269–L271, Feb. 1988.

Chihaya Adachi et al., "Confinement of charge carriers and molecular excitons within 5–nm–thick emitter layer in organic electroluminescent devices with a double hetero-structure", Appl. Phys. Lett., vol. 57, No. 6, pp. 531–533, Aug. 6, 1990.

Yoshiyuki Kuwabara et al., "Thermally Stable Multilayered Organic Electroluminescent Devices Using Novel Starburst Molecules, 4,4',4''–Tris(N–carbazolyl)triphenylamine (TCTA) and 4,4'4''–Tri(3–methylphenylphenyl–amino)triphenylamine (m–MTDATA), as Hole–Transport Materials", Advanced Materials, vol. 6, No. 9, pp. 677–679, 1994, no month.

Hiromitsu Tanaka et al., "Novel hole–transporting materials based on triphenylamine for organic electroluminescent devices", Chem. Commun., pp. 2175–2176, 1996, no month.

Ioan A. Silberg et al., "Free Radicals of Phenothiazine and Related Compounds. VI–Free Radicals and Charge Transfer Complexes of Some Oligophenothiazines", Heterocyclic Communications, vol. 2, pp. 117–124, 1996.

"Organic Electroluminescent Devices Using Distyryl Compound", Chemical Society of Japan, 72nd National Meeting, Lecture, vol. 2, 2PB098, p. 1392, 1997.

Yasuhiro Yamaguchi et al., "Application of Unsymmetrical Diphenoquinone Derivatives of Xerography (1) Molecular Design of a Novel Class of Polymer—dispersible Electron—transport—active Compounds", Journal of the Society of Electrophotography of Japan, vol. 30, No. 3, pp. 266–273, Jul. 1991.

Chihaya Adachi et al., "Organic Electroluminescent Device with a Three–Layer Structure", Japanese Journal of Applied Physics, vol. 27, No. 4, pp. L713–L715, Apr. 1988.

Chihaya Adachi et al., "Organic electroluminescent device having a hole conductor as an emitting layer", Appl. Phys. Lett., vol. 55, No. 15, pp. 1489–1491, Oct. 9, 1989.

Junji Kido et al., "1,2,4–Triazole Derivative as an Electron Transport Layer in Organic Electroluminescent Devices", Jpn. J. Appl. Phys., vol. 32, pp. L917–L920, Jul. 1993.

J. Kido et al., "Organic electroluminescent devices using 1,3,4–thiadiazole derivatives", Polymer Preprints Japan, vol. 43, No. 3, Pla007, p. 978, 1994, no month.

T. Izumizawa et al., "Study on Electroluminescent Behaviors of Metal (III)–quinolinolates", IEICE Technical Report, vol. 92, No. 311, pp. 43–48, Nov. 1992.

Takakazu Yamamoto et al., Polymer Light–Emitting Diodes with Single– and Double–Layer Structures Using Poly(2, 3–diphenylquinoxaline–5,8–diyl), Jpn. J. Appl. Phys., vol. 33, pp. L250–L253, Feb. 1994.

H. Nakada et al., "Blue Organic Electroluminescent Devices Using Phenanthroline Derivatives as an Electron Transport Layer", Polymer Preprints, Japan, vol. 43, No. 7, pp. 2450–2451, 1994, no month.

"Optical Function Material", Functional Polymer Material Series, edited by Society of Polymer Science, Japan, Kyoritsu Shiuppan Co., Ltd., pp. 236–241, 1991, no month.

The Society of Applied Physics and Related Societies, vol. 40, No. 3, p. 1146, Mar. 1993.

Jingping Zhang et al., "The Ground State Spin Multiplicity of Schlenk–type Biradicals and the Influence of additional Linkage to Ladder Type Structures", Chemical Physics, vol. 206, No. 3, pp. 339 to 351, Jun., 1996.

* cited by examiner

CHARGE-TRANSPORTING MATERIAL CONTAINING DIAZAPENTACENE DERIVATIVE, LUMINESCENT MATERIAL, AND ORGANIC ELECTROLUMINESCENT ELEMENT EMPLOYING THESE

TECHNICAL FIELD

The present invention relates to a charge transporting material and a light emitting material containing diazapentacene derivative, and an organic electroluminescent device (hereinafter simply referred to as organic EL device)

BACKGROUND ART

In recent years, organic EL devices have been noted as a candidate for flat panel display having high brightness not found so far and research and development therefor have been made vigorously. The organic EL device has the structure in which a light emitting layer containing a light emitting material is put between two electrodes and holes injected from an anode and electrons injected from a cathode are re-combined to emit light in the light emitting layer.

The organic EL device includes two types. One uses a charge transporting material with addition of a fluorescent dye reported by Tang (C. W. Tang), et al. (Journal of the Applied Physics (J. Appl. Phys.), 65, 3610 (1989)) and the other uses the fluorescent dye itself as the fluorescent layer (for example, device disclosed in Japanese Journal of the Applied Physics (Jpn. J. Appl. Phys.), 27, L269 (1988)).

The organic EL device using the fluorescent dye itself as the light emitting layer is generally classified into further three types. In the first type, the light emitting layer is put between a hole transporting layer and an electron transporting layer to form three layers. In the second type, a hole transporting layer and a light emitting layer are laminated into two layers. In the third type, an electron transporting layer and a light emitting layer are laminated into two layers. It has been known that the luminous efficiency of the organic EL device is improved by laminating in two layers or three layers as described above.

The electron transporting layer in the organic EL device of each of the constitutions described above contains an electron conducting compound as one of charge transporting materials and has a function of conducting electrons injected from a cathode to a light emitting layer. While the hole injecting layer and the hole transporting layer is a layer containing a hole conducting compound as one of charge transporting materials and have a function of conducting the holes injected from the anode to the light emitting layer, when the hole transporting layer and/or hole injecting layer is interposed between the anode and the light emitting layer, more holes are injected at a lower electric field into the light emitting layer and, in addition, electrons injected from the cathode or the electron injecting layer can be confined in the light emitting layer as well, so that an organic EL device of excellent luminescent performance such as improved luminous efficiency can be obtained.

As the hole transporting material and the hole injecting material as one of charge transporting materials used for the hole transporting layer and the hole injecting layer of the organic EL device described above while various materials have been known including triphenylamine derivatives, few of the materials are suitable to practical use at present. For example, while N,N'-diphenyl-N,N'-di(3-methylphenyl)-4,4'-diaminobiphenyl (hereinafter simply referred to as TPD) has been reported (Applied Physics Letter, Vol. 57, No. 6, pp 531, 1990), the compound is poor in the heat stability and involves a problem in view of the life of the device or the like. Various triphenylamines are described also in U.S. Pat. Nos. 5,047,687, 4,047,948 and 4,536,457, JP-B-6-32307, JP-A-5-234681, JP-A-5-239455, JP-A-8-87122 and JP-A-8-259940. Among them, N,N'-di(1-naphthyl)-N,N'-diphenyl-4,4'-diaminobiphenyl (hereinafter simply referred to as NPD) has been known as a compound obtained by improving heat stability of TPD.

JP-A-4-308688, JP-A-6-1972 and Advanced Material, vol. 6, p 677, 1994 describe star-burst amine derivatives, and JP-A-7-126226, JP-A-7-126615, JP-A-7-331238, JP-A-7-97355, JP-A-8-48656 and JP-A-8-100172 and the Journal of the Chemical Society, Chemical Communication p 2175, 1996 and the like also describe hole transporting materials for hole injecting materials improved with heat resistance. Among them, 4,4',4"-tris[N-(3-methylphenyl)-N-phenylamino]triphenylamine as a kind of star burst amine derivatives (hereinafter simply referred to as MTDATA) has been used generally as the hole injecting material for organic EL devices.

However, organic EL devices using the triarylamine derivatives described above have no performance corresponding to the recent demand for higher performance at present. One of the major reasons is insufficient ability of hole injection and, particularly, large ionization potential value of the hole transporting material. For efficiently injecting holes into the organic layer of the organic EL device, it is important for a relation between the work function of the electrode and the ionization potential of the organic compound and lower ionization potential value is more preferred. For this purpose, it has been demanded for the development of hole transporting material having small ionization potential value for improving the performance of the organic EL device.

As described above, since the existent charge transporting materials used for organic EL devices have no practically sufficient performance or involve a problem not capable of coping with higher efficiency, it has been demanded for improving the efficiency and the life of the organic EL device by the use of excellent materials.

On the other hand, Heterocyclic Communications, vol. 2, pp 117, 1996 shows a diazapentacene derivative as the electron donating compound (donor compound) but it contains no descriptions regarding the organic EL device.

DISCLOSURE OF THE INVENTION

The present invention intends to provide an organic EL device, a novel charge transporting material used therefor and a light emitting material having a practically sufficient performance and capable of coping with improvement for the efficiency.

The present inventors have made an earnest study for solving the foregoing subjects involved in existent organic EL devices. As a result, it has been found that an organic EL device at high efficiency can be obtained by the use of specific diazapentacene derivatives to a charge transporting material or light emitting material and the present invention has been accomplished based on the finding described above.

The present invention resides in the following.

(1) A charge transporting material containing a diazapentacene derivative represented by the following general formula (1):

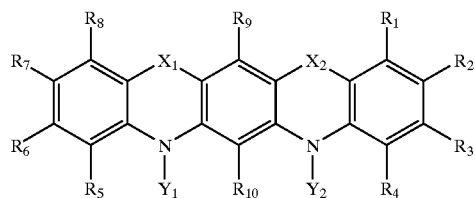

(1)

(in the general formula (1), $R_1$ to $R_{10}$ each represents independently a hydrogen atom, a halogen atom, an alkyl group of 1 to 6 carbon atoms, an alkoxy group, a substituted or not-substituted amino group, an aryl group or a heterocyclic group, in which the substituted or not-substituted aryl group or heterocyclic group, when they are adjacent with each other, may be of a structure condensed to each other, $X_1$ and $X_2$ each represents independently an oxygen atom or a sulfur atom, and $Y_1$ and $Y_2$ each represents independently a substituted or not-substituted alkyl group of 1 to 6 carbon atoms, an aryl group or a heterocyclic group).

(2) A light emitting material containing a diazapentacene derivative represented by the general formula (1) described in item (1).
(3) An organic electroluminescent device using a charge transporting material as described in item (1) and/or a light emitting material as described in item (2).
(4) An organic electroluminscent device having a hole transporting layer in which a charge transporting material described in item (1) is incorporated in the hole transporting layer.
(5) An organic electroluminscent device having a hole injecting layer in which a charge transporting material described in item (1) is incorporated in the hole injecting layer.
(6) An organic electroluminescent device having a light emitting material described in item (2) above in the light emitting layer.

BEST MODE FOR PRACTICING THE INVENTION

The present invention is to be explained more specifically.

Specific examples of the diazapentacene derivatives represented by the general formula (1) can include those compounds represented, for example, by the following formulae (2) to (9):

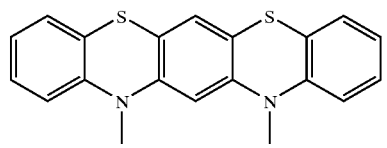

(2)

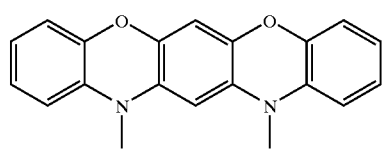

(3)

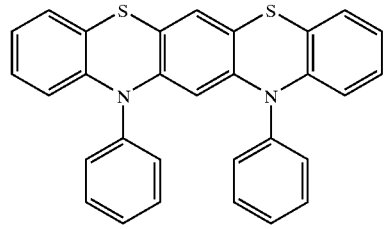

(4)

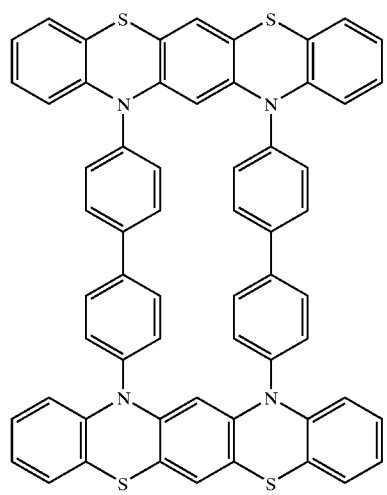

(5)

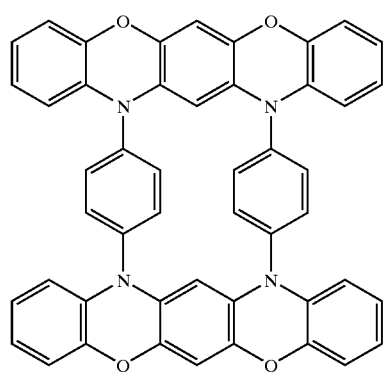

(6)

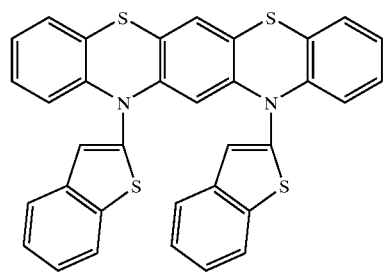

(7)

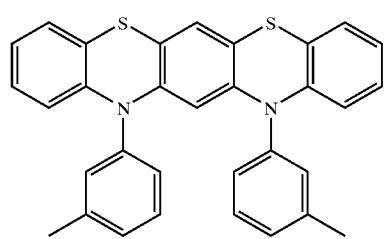

(8)

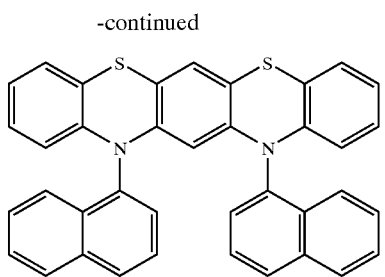

(9)

The diazapentacene derivatives can be synthesized by utilizing known synthesis processes and, for example, can be obtained by the method described in synthetic examples to be described later.

The charge transporting material containing the diazapentacene derivative according to the present invention is suitable to a hole transporting material and a hole injecting material. This is attributable to introduction of a phenoxazine or phenothiazine skeleton in the molecule. Particularly, since diazapentacene according to the present invention has two such skeletons in the molecule, it has a low potential value and can provide an organic EL device of higher efficiency. It is also important that the position for the introduction of the skeletons, that is, nitrogen atoms situate on the identical side.

Further, the organic EL device according to the present invention has not only high efficiency but also high durability during storage and driving. This is also one of the features of the diazapentacene derivative used in the present invention. As the substituent $Y_1$ or $Y_2$ in the general formula (1), an aryl group or a heterocyclic group is preferred but an alkyl group is somewhat poor in durability. The diazapentacene derivative represented by the general formula (1) emits fluorescence by itself and also has function as a light emitting material. For example, the compound represented by the formula (2) above emits blue fluorescence, and the compound represented by the formula (4) emits green fluorescence.

The structure of the organic EL device according to the present invention includes various kinds of forms and, basically, it has a structure of interposing an organic layer containing the diazapentacene derivative (hereinafter referred to as a diazapentacene derivative layer) between an anode and a cathode. Depending on the requirement, a hole injecting material, a hole transporting material, a light emitting material, an electron injecting material or an electron transporting material, etc. used usually for organic EL devices can be added to the diazapentacene derivative layer. Further, when the diazapentacene derivative layer is used as a light emitting layer, light of different wavelength can be generated or the luminous efficiency can be improved by adding other light emitting material to the light emitting layer.

Further, a hole injecting material, a hole transporting material, a light emitting material, an electron injecting material or an electron transporting material used usually for the organic EL device can be laminated, for example, as a hole injecting layer, a hole transporting layer, a light emitting layer, an electron injecting layer or an electron transporting layer to the diazapentacene derivative layer.

The concrete constitution can include laminate structures such as (1) anode/diazapentacene derivative layer/cathode, (2) anode/diazapentacene derivative layer/light emitting layer/cathode, (3) anode/diazapentacene derivative layer/ light emitting layer/electron injecting layer/cathode, (4) anode/hole injecting layer/diazapentacene derivative layer/ light emitting layer/electron injecting layer/cathode, (5) anode/diazapentacene derivative layer/hole transporting layer/light emitting layer/electron injecting layer/cathode, and (6) anode/hole injecting layer/diazapentacene derivative layer/electron injecting layer/cathode. In the cases, the luminous efficiency can be improved or the life can be extended by further disposing an interface layer. The interface layer is a layer interposed between the electrode and the diazapentacene derivative layer, which functions effectively for promoting the charge injection and improving the durability of the device.

In any of the structures described above, the organic EL device according to the present invention is preferably supported on a substrate. Any of substrates having mechanical strength, heat stability and transparency may be used and, for example, glass or transparent plastic film can be used.

For the anode substance of the organic EL device according to the present invention, a metal, an alloy, an electroconductive compound or a mixture of them having a work function of 4 eV or more can be used. Specific examples can include a metal such as Au, or a conductive transparent material such as CuI, indium tin oxide (hereinafter simply referred to as ITO), $SnO_2$ or ZnO.

As the cathode substance, a metal, an alloy, an electroconductive compound and a mixture thereof having a work function of 4 eV or less can be used. Specific examples can include, for example, calcium, magnesium, lithium, aluminum, magnesium alloy, lithium alloy and aluminum alloy, the alloy including aluminum/lithium, magnesium/silver or magnesium/indium.

For improving the luminous efficiency of the organic EL device, at least one of the electrodes preferably has a light transmittance of 10% or more. The sheet resistance of the electrode is preferably several hundreds Ω/mm or less. The film thickness depends on the nature of the electrode material and is usually selected within a range from 10 nm to 1 µm, preferably, 10 to 400 nm. Such electrode can be prepared by forming a thin film using the electrode substance described above by a method such as vapor deposition or sputtering.

As the hole injecting material and the hole transporting material other than the charge transporting material according to the present invention used for the organic EL device of the present invention, any of those used customarily so far as the hole charge transporting material or known charge transporting material used for the hole injecting layer and the hole transporting layer of organic EL devices can be selected and used.

They can include, for example, carbazole derivatives (such as N-phenylcarbazole and polyvinyl carbazole), triaryl amine derivatives (TPD, polymers having an aromatic tertiary amine on the main chain or side chain, 1,1-bis(4-di-p-tolylaminophenyl)cyclohexane, N,N'-diphenyl-N,N'-dinaphthyl-4,4'-diaminobiphenyl, 4,4',4"-tris{N-(3-methylphenyl)-N-phenylamino}triphenylamine, compounds described in Journal of The Chemical Society Chemical Communication, p 2175, 1996, compounds described in JP-A-57-144558, JP-A-61-62038, JP-A-61-124949, JP-A-61-134354, JP-A-61-134355, JP-A-61-112164, JP-A-4-308688, JP-A-6-312979, JP-A-6-267658, JP-A-7-90256, JP-A-7-97355, JP-A-6-1972, JP-A-7-126226, JP-A-7-126615, JP-A-7-331238, JP-A-8-100172 and JP-A-8-48656 and star-burst amine derivatives described in Advanced material, vol. 6, p677, 1994), stilbene derivatives (those described in Chemical Society of Japan, 72th Spring Meeting, Pre-text (II), p1392, 2PB098), phthalocyanine derivatives (non-metal or copper phthalycyanine, etc.) and polysilanes.

The hole injecting layer and the hole transporting layer for the organic EL device of the present invention may be constituted with one layer containing one or more of the compounds described above, or may be constituted with one layer containing one or more of the compounds described above and the charge transporting material of the present invention. Alternatively, it may be a plurality of layers in lamination containing one or more of the compounds described above, or a plurality of layers in lamination containing one or more of the compounds described above and the charge transporting material of the present invention.

There is no particular restriction on the electron injecting material and the electron transporting material other than the charge transporting material of the present invention and any of those used customarily so far as the electron conducting compound or those known compounds used for the electron injecting layer and the electron transporting layer of the organic EL device can be selected and used.

Preferred example of the electron conducting compounds can include, for example, diphenylquinone derivatives (those described, for example, in the Journal of Electrophotographic Society, 30, 266 (1991)) perylene derivatives (those described, for example, in J. Apply. Phys., 27, 269 (1988)), oxadiazole derivatives (literatures described above, Jpn. J. Appl. Phys., 27, L713 (1988), Applied Physics, Letter (Appl. Phys. Lett.), 55, 1489 (1989)), thiophene derivatives (those described, for example, in JP-A-4-212286), triazole derivatives (those described, for example, in Jpn. J. Appl. Phys.,32, L917 (1993)), thiadiazole derivatives (those described, for example, in 43th Polymer Society, Pre-text. (III) P1a007), metal complexes of oxine derivatives (those described for example in Electronic Information and Communication Society, Technical Research Report, 92 (311), 43 (1992) or the like),quinoxaline derivative polymers (those described, for example, in Jpn. J. Appl. Phys. 33, L250 (1994), and phenanthroline derivatives (those described in 43th Polymer Discussion Meeting, Pre-text, 14J07).

As the light emitting material other than the light emitting material of the present invention used for the light emitting layer of the organic EL device according to the present invention, known light emitting materials such as daylight fluorescent material, fluorescent whitener, laser dye, organic scintillator and various kinds of fluorescence analyzing reagent as described in polymer functional material series "Light Functional Material", edited by Polymer Society and published from Kyoritsu Shuppan (1991), p236 can be used.

Specifically, preferred are polynuclear condensed compounds such as anthracene, phenanthrene, pyrene, chrysene, perylene, coronene, rubrene, and quinacridone, oligophenylene series compounds such as quarter phenyl, scintillators for use in liquid scintillation such as 1,4-bis(2-methylstyryl)benzene, 1,4-bis(4-methylstyryl)benzene, 1,4-bis(4-methyl-5-phenyl-2-oxazolyl)benzene, 1,4-bis(5-phenyl-2-oxazolyl)benzene, 2,5-bis(5-tertiary-butyl-2-benzoxazolyl)thiophene, 1,4-diphenyl-1,3-butadiene, 1,6-diphenyl-1,3,5-hexatriene, and 1,1,4,4-tetraphenyl-1,3-butadiene, metal complexes of oxine derivatives described in JP-A-63-264692, cumarine dye, dicyanomethylenepyrane dye, dicyanomethylenethiopyrane dye, polymethine dye, oxobenzanthracene dye, xanthene dye, carbostyryl dye and perylene dye, oxazine series compounds described in German Patent No. 2534713, stilbene derivatives described in the Pre-text of 40th associated meeting of society of Applied Physics, 1146 (1993), spiro compounds described in JP-A-7-278537, and oxadiazole series compounds described in JP-A-4-363891.

Each of the layers constituting the organic EL device of the present invention can be formed by preparing a material to constitute each of the layers into a thin film by a known method such as a vapor deposition method, a spin coating method and a casting method.

There is no particular restriction on the thickness for each of the layers formed as described above and can be properly selected in accordance with the nature of the material and it is usually selected within a range from 2 nm to 5000 nm.

For preparing the diazapentacene derivative into a thin film, it is preferred to adopt a vapor deposition method in view of easy availability for uniform film and less formation of pinholes. In a case of preparing a thin film by using the vapor deposition method, the vapor deposition conditions are different depending on the kind of the diazapentacene derivatives, the aimed crystal structure and association structure of the accumulated molecule film and, generally, they are desirably selected properly within a range at a boat heating temperature from 50 to 400° C., under a vacuum degree of from $10^{-6}$ to $10^{-3}$ Pa, with a vapor deposition rate of from 0.01 to 50 nm/sec, at a substrate temperature from −150 to +300° C. and with a film thickness of 5 nm to 5 $\mu$m.

Then, an example of a method of preparing an organic EL device using the diazapentacene derivative according to the present invention is to be explained for the method of manufacturing an organic EL device comprising the anode/diazapentacene derivative layer/cathode described above. After forming a thin film comprising an anode substance to a thickness in a range of 1 $\mu$m or less, preferably, 10 to 200 nm on an appropriate substrate to prepare an anode, a thin film of the diazapentacene derivative is formed on the anode to constitute a light emitting layer, and a thin film comprising a cathode substance is formed by a vapor deposition method to a thickness of 1 $\mu$m or less to prepare a cathode on the light emitting layer, thereby obtaining an aimed organic EL device. In the manufacture of the organic EL device described above, the cathode, the light emitting layer and the anode can be prepared in this order while inverting the preparing procedures.

When a DC voltage is applied to the thus obtained organic EL device the voltage may be applied with the anode as (+) polarity and the cathode as (−) polarity. When a voltage at about 2 to 40 V is applied, light emission can be monitored from the transparent or semi-transparent electrode (anode and/or cathode).

Further, the organic EL device emits light also in a case of applying an AC voltage. Waveform of the applied AC voltage may be optional.

EXAMPLE

Then, the present invention is to be described more specifically with reference to examples.

(1) Synthesis Example 1

Synthesis of a Compound Represented by the Formula (2) (Hereinafter Simply Referred to as MAT)

183 mg of sodium hydride and 20 ml of dimethyl sulfoxide were charged in a flask, to which a 5 ml DMSO solution containing 200 mg of 5,7,12,14-tetrahydro-5,7-diaza-12,14-dithiopentacene was dropped in a nitrogen atmosphere. After the evolution of hydrogen was ceased, 0.4 ml of dimethyl sulfate was added and heated at 60° C. for 1 hr. After allowing them to be cooled, the reaction mixture was poured into cold water and extracted with ethyl acetate. After drying the resultant organic layer over anhydrous sodium sulfate, the solvent was removed by distillation. The residue was purified by silica gel column chromatography (heptane/ethyl acetate=3/1), which was recrystallized using ethanol to obtain 97 mg of the aimed compound as yellow plate-like crystals. The ionization potential according to AC-1 measurement was 4.8 eV.

$^1$H-NMR (CDCl$_3$) δ=3.40(s, 6H), 6.30(s, 1H), 6.90(d, 2H), 6.88–6.94(m, 3H), 7.11–7.18(m, 4H)

(2) Synthesis Example 2
Synthesis of a Compound Represented by the Formula (3) (Hereinafter Simply Referred to as MAO)

Synthesis was conducted by the method according to Synthesis Example 1 except for replacing 5,7,12,14-tetrahydro-5,7-diaza-12,14-dithiopentacene with 5,7,12,14-tetrahydro-5,7-diaza-12,14-dioxapentacene. The ionization potential according AC-1 measurement was 4.8 eV.

$^1$H-NMR (CDCl$_3$) δ=3.05(s, 6H), 6.11(s, 1H), 6.28 (s, 1H), 6.65–6.70(m, 6H), 6.88(m, 2H)

(3) Synthesis Example 3
Synthesis of a Compound Represented by the Formula (4) (Hereinafter Simply Referred to as PAT)

2.5 g of 5,7,12,14-tetrahydro-5,7-diaza-12,14-dithiopentacene, 8.6 g of potassium carbonate, 2 g of copper and 50 ml of iodobenzene were charged in a flask and heated in a nitrogen atmosphere at 190° C. for 15 hours. After allowing them to cool, insoluble matters were removed by filtration and iodobenzene was removed by distillation. The resultant solids were cleaned with 200 ml of heptane, which was recrystallized using methanol and tetrahydrofuran to obtain 3 g of an aimed compound. The ionization potential according to AC-1 measurement was 4.8 eV.

$^1$H-NMR (CDCl$_3$) δ=5.09(s, 1H), 6.02(dd, 2H), 6.79–6.83(m, 5H), 7.02–7.11(m, 6H), 7.37–7.42(m, 6H)

(4) Synthesis Example 4
Synthesis of a Compound Represented by the Formula (5) Described Above Synthesis was conducted by the method according to Synthesis Example 3 except for replacing iodobenzene used in Synthesis Example 3 with 4,4'-diiodobiphenyl.

(5) Synthesis Example 5
Synthesis of a Compound Represented by the Formula (8) Described Above Synthesis was conducted by the method according to Synthesis Example 3 except for replacing iodobenzene used in Synthesis Example 3 with metaiodotoluene. The ionization potential according to AC-1 measurement was 5.0 eV.

(6) Synthesis Example 6
Synthesis of a Compound Represented by the Formula (9) Described Above Synthesis was conducted by the method according to Synthesis Example 3 except for replacing iodobenzene used in Synthesis Example 3 with 1-iodonaphthalene. The ionization potential according to AC-1 measurement was 5.1 eV.

Comparative Example 1
Ionization Potential of Amine Derivative

Ionization potentials of NPD and MTDATA according to AC-1 measurement were 5.5 and 5.2 eV respectively. The diazapentacene derivative according to the present invention showed a lower value.

Example 1

ITO vapor was deposited to 50 nm thickness on a glass substrate of 25 mm×75 mm×1.1 mm (manufactured by Tokyo Sanyo Shinku Co.), which was used as a transparent support substrate. The transparent support substrate was fixed to a substrate holder of a commercially available vapor deposition apparatus (manufactured by Shinku Kiko Co.), to which were mounted a boat containing MAT synthesized in Synthesis Example 1, a boat containing MAO synthesized in Synthesis Example 2, a boat containing aluminum (III) tris-8-hydroxyquinoline (hereinafter simply referred to as Alq), a boat containing lithium fluoride and a boat incorporating aluminum.

The vacuum vessel was depressurized to $1\times10^{-3}$ Pa and boats incorporating MAT and MAO were heated to vapor deposit them to 50 nm thickness at a weight ratio 1:1 to form a hole transporting layer and then the Alq-containing boat was heated and vapor deposited to a thickness of 50 nm to form a light emitting layer. The vapor deposition rate was 0.1 to 0.2 nm/sec.

Subsequently, the boat was heated to vapor deposit lithium fluoride to a film thickness of 0.5 nm and, successively, aluminum was vapor deposited to a film thickness of 100 nm and an electrode was formed thereby obtaining an organic EL device.

When a DC voltage was applied using the ITO electrode as an anode and the aluminum electrode as a cathode, about 20 mA/cm$^2$ of current was flown to obtain green light emission at a brightness of about 20 cd/m$^2$.

Example 2

In accordance with Example 1, a transparent support substrate was fixed to a substrate holder of a vapor deposition apparatus, to which were mounted a boat containing MAT synthesized in Synthesis Example 1, a boat containing MAO synthesized in Synthesis Example 2, a boat containing NPD, a boat containing Alq, a boat containing lithium fluoride and a boat containing aluminum.

A vacuum vessel was depressurized to $1\times10^{-3}$ Pa, and boats containing MAT and MAO were heated to vapor deposit them to a film thickness of 20 nm at 1:1 weight ratio to form a hole injecting layer. Then, the boat containing NPD was heated to evaporate the material to a film thickness of 30 nm to form a hole transporting layer. Further, the Alq containing boat was heated to evaporate the material to a film thickness of 50 nm to form a light emitting layer. The vapor deposition rate was 0.1 to 0.2 nm/sec.

Subsequently, the boat was heated to evaporate lithium fluoride to a film thickness of 0.5 nm and, successively, aluminum was vapor deposited to a film thickness of 100 nm to form an electrode thereby obtaining an organic EL device.

When a DC voltage was applied using the ITO electrode as an anode and the aluminum electrode as a cathode, about 4 mA/cm$^2$ of current was flown to obtain green light emission at a brightness of about 100 cd/m$^2$.

Example 3

In accordance with Example 1, a transparent support substrate was fixed to a substrate holder of a vapor deposition apparatus, to which were mounted a boat containing PAT synthesized in Synthesis Example 3, a boat containing NPD, a boat containing Alq, a boat containing lithium fluoride and a boat containing aluminum.

A vacuum vessel was depressurized to 1×10⁻³ Pa, and the boat containing PAT was heated to vapor deposit the material to a film thickness of 20 nm to form a hole injecting layer. Then, the boat containing NPD was heated to evaporate the material to a film thickness of 30 nm to form a hole transporting layer. Further, the Alq containing boat was heated to evaporate the material to a film thickness of 50 nm to form a light emitting layer. The vapor deposition rate was 0.1 to 0.2 nm/sec.

Subsequently, the boat was heated to evaporate lithium fluoride to a film thickness of 0.5 nm and, successively, aluminum was vapor deposited to a film thickness of 100 nm to form an electrode thereby obtaining an organic EL device.

When a DC voltage was applied using the ITO electrode as an anode and the aluminum electrode as a cathode, about 3 mA/cm² of current was flown to obtain green light emission at a brightness of about 100 cd/m².

Example 4

A device was prepared by the method according to Example 3 excepting for replacing Alq used in Example 3 with 1,1,3,4-tetraphenyl-2,5-bis(5-benzothienylthienyl)silacyclopentadiene.

When a DC voltage was applied using the ITO electrode as an anode and the aluminum electrode as a cathode, about 20 mA/cm² of current was flown to obtain red light emission at a brightness of about 100 cd/m².

Example 5

A device was prepared by the method according to Example 3 excepting for replacing Alq used in Example 3 with 1,2-bis(1-methyl-2,3,4,5-tetraphenylsilacyclopentadienyl)ethane.

When a DC voltage was applied using the ITO electrode as an anode and the aluminum electrode as a cathode, about 2 mA/cm² of current was flown to obtain blue light emission at a brightness of about 100 cd/m².

Example 6

A device was prepared by a method according to Example 3 except for replacing PAT used in Example 3 with a compound obtained in Synthesis Example 5.

When a DC voltage was applied using the ITO electrode as an anode and the aluminum electrode as a cathode, about 3 mA/cm² of current was flown to obtain green light emission at a brightness of about 100 cd/m².

Example 7

A device was prepared by a method according to Example 3 except for replacing PAT used in Example 3 with a compound obtained in Synthesis Example 6.

When a DC voltage was applied using the ITO electrode as an anode and the aluminum electrode as a cathode, about 3 mA/cm² of current was flown to obtain green light emission at a brightness of about 100 cd/m².

INDUSTRIAL APPLICABILITY

An organic EL device at high efficiency can be obtained by using the charge transporting material and a light emitting material according to the present invention containing a specified diazapentacene derivative. That is, in accordance with the EL device of the present invention, highly efficient light emission can be attained easily by using the charge transporting material and the light emitting material containing the diazapentacene derivatives of a low ionization potential value as the organic layer forming the hole transporting layer, the hole injecting layer and/or the light emitting layer. Accordingly, a display device at high efficiency such as a full color display can be prepared by using the organic EL device according to the present invention.

What is claimed is:

1. An organic electroluminescent device comprising an organic layer interposed between a pair of electrodes wherein the organic layer contains a charge transporting material represented by the formula (1):

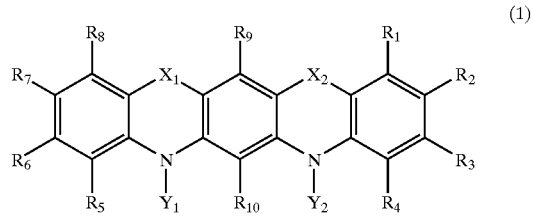

in which $R_1$ to $R_{10}$ each independently represents a hydrogen atom, a halogen atom, an alkyl group of 1 to 6 carbon atoms, an alkoxy group, a substituted or unsubstituted amino group, a substituted or unsubstituted aryl group or a substituted or unsubstituted heterocyclic group, in which the substituted or unsubstituted aryl group or the substituted or unsubstituted heterocyclic group, when they are adjacent with each other, may be of a structure condensed to each other, $X_1$ and $X_2$ each independently represents an oxygen atom or a sulfur atom, and $Y_1$ and $Y_2$ each independently represents a substituted or unsubstituted alkyl group of 1 to 6 carbon atoms, an aryl group or a heterocyclic group.

2. An organic electroluminescent device as described in claim 1 in which the organic layer is a hole transporting layer.

3. An organic electroluminescent device as described in claim 1 in which the organic layer is a hole injecting layer.

4. An organic electroluminescent device comprising a light emitting layer interposed between a pair of electrodes wherein the light emitting layer contains a light emitting material represented by formula (1):

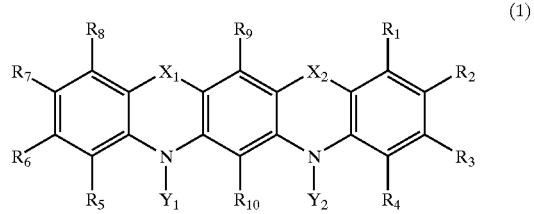

in which $R_1$ to $R_{10}$ each independently represents a hydrogen atom, a halogen atom, an alkyl group of 1 to 6 carbon atoms, an alkoxy group, a substituted or unsubstituted amino group, a substituted or unsubstituted aryl group or a substituted or unsubstituted heterocyclic group, in which the substituted or unsubstituted aryl group or the substituted or unsubstituted heterocyclic group, when they are adjacent with each other, may be of a structure condensed to each other, $X_1$ and $X_2$ each independently represents an oxygen atom or a sulfur atom, and $Y_1$ and $Y_2$ each independently represents a substituted or unsubstituted alkyl group of 1 to 6 carbon atoms, an aryl group or a heterocyclic group.

5. An organic electroluminescent device comprising a hole injecting layer and a light emitting layer interposed between a pair of electrodes wherein the hole injecting layer contains a charge transporting material represented by the formula (1) and the light emitting layer contains a light emitting material represented by formula (1):

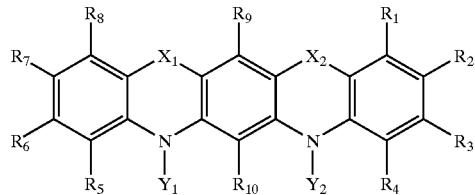

(1)

in which $R_1$ to $R_{10}$ each independently represents a hydrogen atom, a halogen atom, an alkyl group of 1 to 6 carbon atoms, an alkoxy group, a substituted or unsubstituted amino group, a substituted or unsubstituted aryl group or a substituted or unsubstituted heterocyclic group, in which the substituted or unsubstituted aryl group or the substituted or unsubstituted heterocyclic group, when they are adjacent with each other, may be of a structure condensed to each other, $X_1$ and $X_2$ each independently represents an oxygen atom or a sulfur atom, and $Y_1$ and $Y_2$ each independently represents a substituted or unsubstituted alkyl group of 1 to 6 carbon atoms, an aryl group or a heterocyclic group.

* * * * *